United States Patent
Sugahara (10) Patent No.: US 8,214,725 B2
(45) Date of Patent: Jul. 3, 2012

(54) MEMORY ACCESS SYSTEM

(75) Inventor: Takahiko Sugahara, Osaka (JP)

(73) Assignee: MegaChips Corporation, Osaka-shi (JP)

(*) Notice: Subject to any disclaimer, the term of this patent is extended or adjusted under 35 U.S.C. 154(b) by 1028 days.

(21) Appl. No.: 12/170,102

(22) Filed: Jul. 9, 2008

(65) Prior Publication Data

US 2009/0044076 A1 Feb. 12, 2009

(30) Foreign Application Priority Data

Aug. 7, 2007 (JP) ................................ 2007-205651

(51) Int. Cl.
*H03M 13/00* (2006.01)
(52) U.S. Cl. .................... 714/785; 714/764; 714/799
(58) Field of Classification Search .................. 714/785, 714/764, 718, 799, 5, 6, 47, 52
See application file for complete search history.

(56) References Cited

U.S. PATENT DOCUMENTS

| | | | | |
|---|---|---|---|---|
| 5,276,849 A | * | 1/1994 | Patel | 711/141 |
| 5,586,127 A | * | 12/1996 | Moriuchi | 714/769 |
| 7,516,371 B2 | * | 4/2009 | Sakaue et al. | 714/52 |
| 2005/0210184 A1 | | 9/2005 | Chen et al. | |

OTHER PUBLICATIONS

U.S. Appl. No. 12/115,098, filed May 5, 2008, Sugahara.

* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

The Error Correction Code (ECC) circuit generates the first syndrome of write data, which have not been written to the memory. The Error Detection Code (EDC) circuit generates the second syndrome of verification read data, which have been written to the memory. The EDC circuit detects errors due only to the "read disturb phenomenon" using the second syndrome, the errors occurring in data scanned from the memory. The ECC circuit detects and corrects errors due to the "program disturb phenomenon" and the "read disturb phenomenon" using the first syndrome, the errors occurring in the data in which the errors due only to the "read disturb phenomenon" have been detected. As a result, both the circuit size and the processing time can be reduced.

11 Claims, 10 Drawing Sheets

MEMORY ACCESS SYSTEM

BACKGROUND OF THE INVENTION

1. Field of the Invention

The present invention relates to a technique to avoid unintended rewriting of data or reduce the possibility thereof, due to repeated readouts of data from a nonvolatile memory.

2. Description of the Background Art

NAND flash memories, among nonvolatile memories, are heavily used for SD memory cards or the like for the purpose of achieving high integration, reduction in manufacturing cost and easy writing for users by simplifying circuit configurations.

In recent, NAND flash memories are adopted for game machines or the like. When the NAND flash memories are used for game machines, there occurs no write operation but only consecutive read operations. In other words, NAND flash memories have been increasingly adopted as ROMs.

Since specific programs are repeatedly read out in the game machines or the like in most cases, however, it begins to be noticed that the programs could be unintendedly rewritten. Such a phenomenon is termed "read disturb phenomenon", and the mechanism of this phenomenon will be briefly discussed below.

Figure 12:
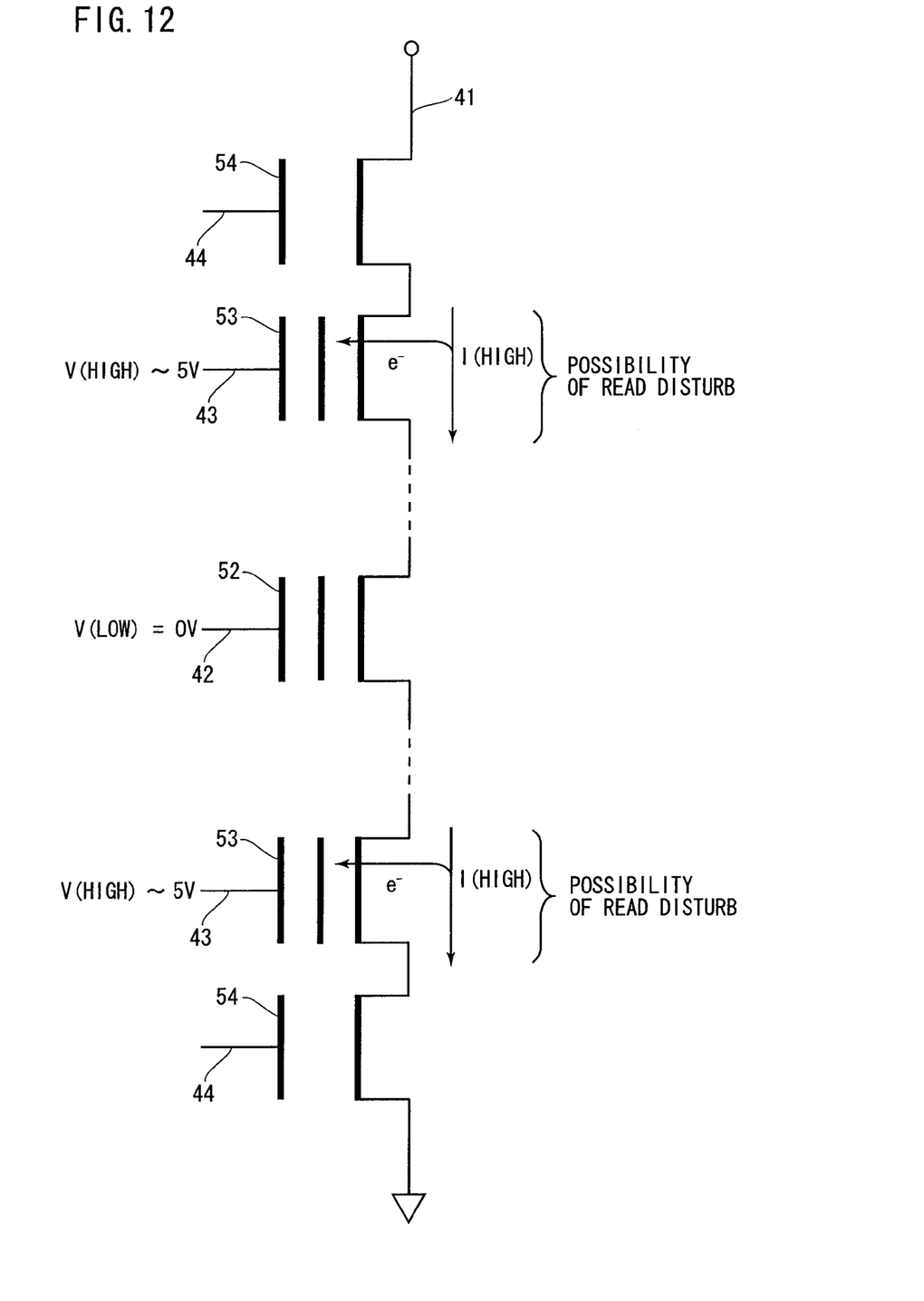
FIG. 12 is a schematic diagram showing a NAND flash memory.

FIG. 12 is a schematic diagram showing a NAND flash memory. The NAND flash memory is constituted of a bit line 41 and word lines 42, 43 and 44 which are arranged in a lattice manner, memory cells 52 and 53, a selection transistor 54 and the like.

In a case where binary data ("0" or "1") stored in the memory cell 52 is read out, the memory cell 52 is a selected cell and the memory cell 53 is an unselected cell. First, the selection transistor 54 specifies the bit line 41 to which the selected cell 52 belongs. Next, a low gate voltage (V(Low)= 0V) is applied to the word line 42 to which the selected cell 52 belongs. Then, a high gate voltage (V(High) of approximately 5V) is applied to the word line 43 to which the unselected cell 53 belongs.

At that time, since the unselected cell 53 is in a very weak writing condition, electrons are trapped in a floating gate of the unselected cell 53 and accumulated therein. In other words, when binary data stored in the selected cell 52 is repeatedly read out, there is a possibility that a threshold voltage of the unselected cell 53 might be shifted and binary data stored in the unselected cell 53 might be unintendedly rewritten, being changed from "1" to "0".

Even if the binary data stored in the unselected cell 53 is unintendedly rewritten, however, when data are collectively erased before new data are written, it is possible to recover the function of the unselected cell 53. But, if there occurs no write operation and only consecutive read operations, it is impossible to recover the function of the unselected cell 53.

US Patent Application Publication No. 2005/0210184 discloses means for avoiding the above-discussed "read disturb phenomenon" by controlling the inside of a memory cell. This disclosed method, however, can be applied to a memory having a specific cell configuration but can not be applied to any other cell configuration. In other words, by this method, it is impossible to avoid the "read disturb phenomenon" without depending on cell configurations of memories.

SUMMARY OF THE INVENTION

The present invention is directed to a memory access system including a memory controller for controlling access to a memory, and a host for outputting a command to the memory controller.

The memory access system of the invention includes: a part for generating a first syndrome of first data not yet written to the memory, the first syndrome being used to correct a first error occurring in the first data, a part for generating a second syndrome of second data already written to the memory, the second syndrome being used to detect a second error occurring in the second data; an error detection part for detecting the second error using the second syndrome, the second error occurring in third data read from the memory; an error correction part for correcting the first error using the first syndrome, the first error occurring in data in which the second error has been detected, out of the third data; and a part for writing data in which the first error has been corrected to the memory.

According to this invention, the first syndrome of data not yet written to the memory and the second syndrome of data already written to the memory are generated. The data read from the memory are error-detected by the second syndrome. The data in which errors have been detected by the second syndrome are error-corrected by the first syndrome.

In the present embodiment, the memory is used as a ROM. The errors detected by the second syndrome are errors due only to the "read disturb phenomenon". The errors corrected by the first syndrome are errors due to the "program disturb phenomenon" and the "read disturb phenomenon".

According to this invention, the memory access system corrects errors due to the "program disturb phenomenon" and the "read disturb phenomenon", in the data in which errors due only to the "read disturb phenomenon" have been detected. The memory access system can avoid or reduce the "read disturb phenomenon" without spending much time for error detection or correction.

According to another aspect of the present invention, the third data includes data read from an address selected using a predetermined algorithm when the memory is not being accessed.

According to this invention, the memory access system detects and corrects errors in read data and scan data. The memory access system corrects errors due to the "program disturb phenomenon" and the "read disturb phenomenon", in data in which errors due only to the "read disturb phenomenon" have been detected before the errors due to the "read disturb phenomenon" are excessively accumulated. The memory access system can avoid or reduce the "read disturb phenomenon" without increasing the circuit size or spending much time for error detection or correction.

Therefore, it is an object of the present invention to provide techniques for avoiding unintended rewriting of data or reducing the possibility thereof, due to repeated readouts of data from a non-volatile memory.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A first embodiment is described as follows with reference to the drawings. First, the components of a memory access system and of a memory are described. Then, the process flows of the memory access system are described in the following order: (1) a writing process flow, (2) a verification reading process flow after the writing, (3) a normal reading process flow, and (4) a refreshing process flow after error detection.

<The Components of the Memory Access System and of the Memory>

Figure 1:
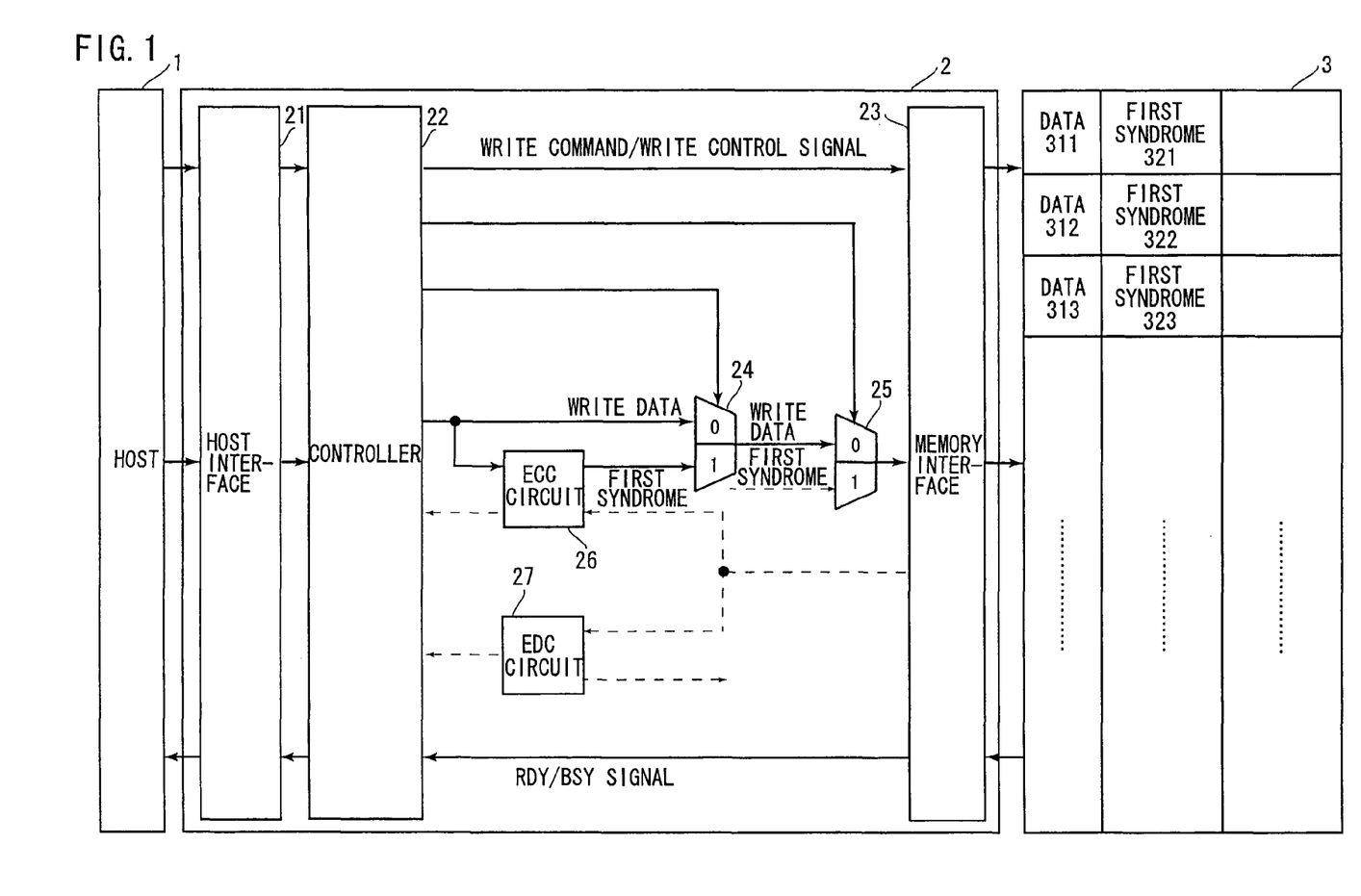
FIG. 1 is a block diagram showing the components of a memory access system and of a memory.
Figure 3:
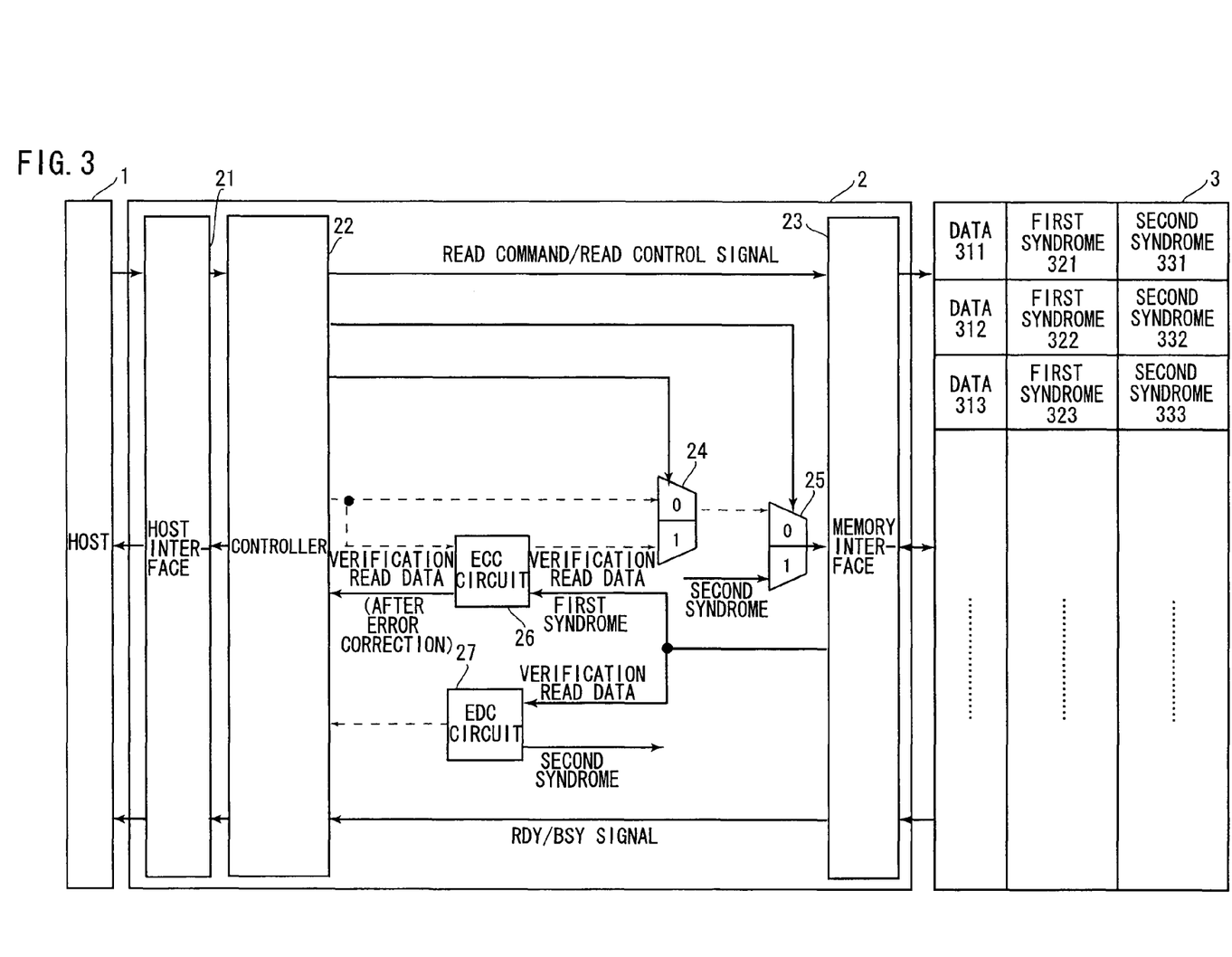
FIG. 3 is a block diagram showing the components of a memory access system and of a memory.
Figure 5:
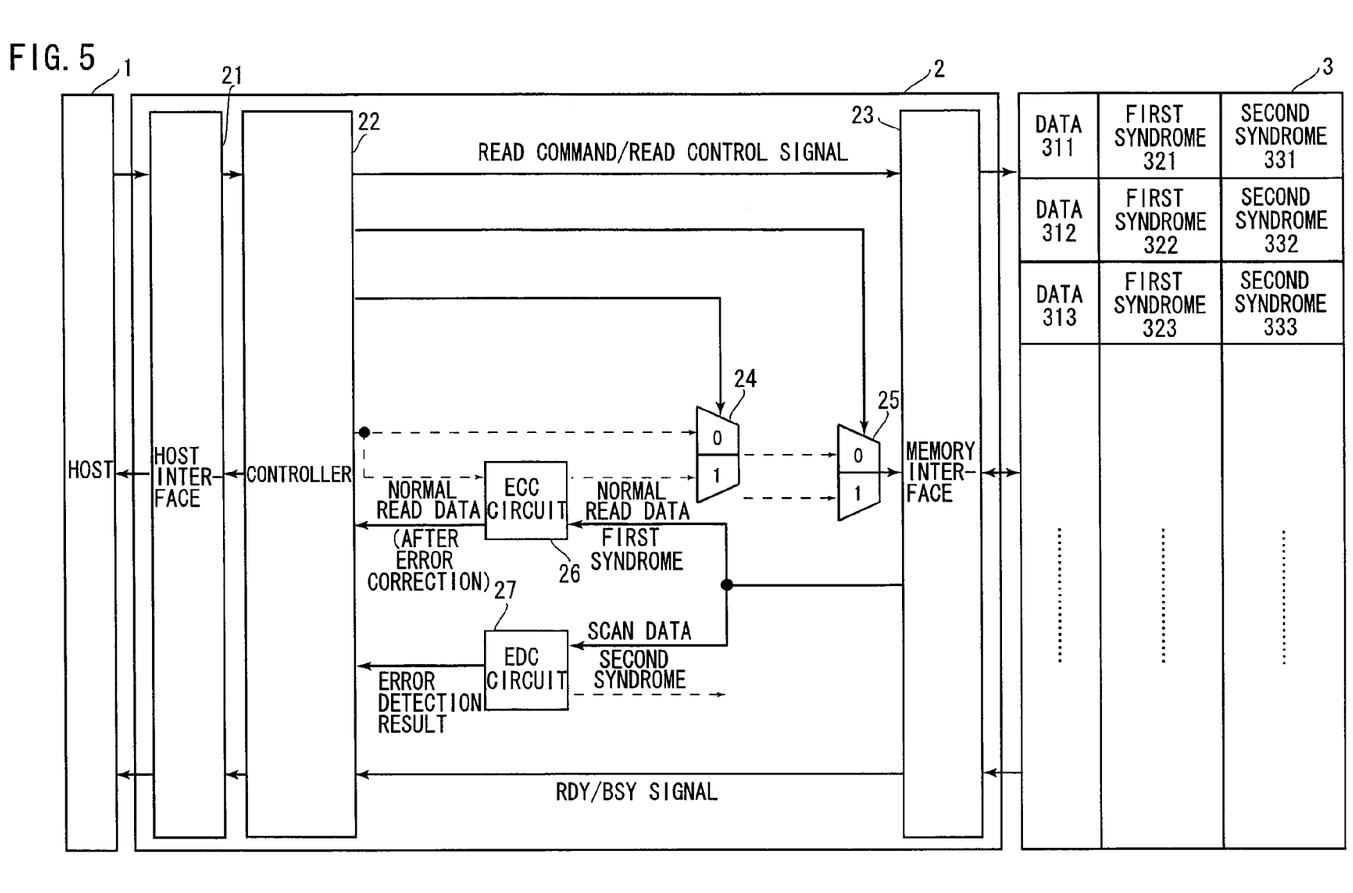
FIG. 5 is a block diagram showing the components of a memory access system and of a memory.

FIGS. 1, 3, and 5 are block diagrams showing the components of the memory access system and of the memory. FIGS. 1, 3, and 5 also show information exchange in the writing process flow, the verification reading process flow, and the normal reading process flow, respectively.

The memory access system, which is a system to access a memory 3, is constituted of a host 1 and a memory controller 2 and the like. The host 1 requires the memory controller 2 to write or read data to or from the memory 3. The host 1 also requires the memory controller 2 to inform it of an error detection result and to write error-corrected data to the memory 3.

The memory controller 2 writes or reads data to or from the memory 3 upon request from the host 1. The memory controller 2 also scans the memory 3 so as to detect errors. Upon request from the host 1, the memory controller 2 informs the host 1 of the error detection result, and writes error-corrected data to the memory 3.

The memory 3 inputs or outputs data from or to the memory controller 2 upon request therefrom. The memory 3 stores not only data to be written or read by the host 1, but also syndromes used by the memory controller 2 to detect and correct errors.

The memory 3 of the present embodiment can be either an SLC (Single-Level Cell) NAND flash memory or an MLC (Multi-Level Cell) NAND flash memory. In more general terms, the present embodiment can be implemented with a nonvolatile memory in which when data stored at a read address are repeatedly read out, there is a possibility that data stored at a non-read address are unintentionally rewritten.

The memory controller 2 includes a host interface 21, a controller 22, a memory interface 23, selectors 24 and 25, an ECC (Error Correction Code) circuit 26, and an EDC (Error Detection Code) circuit 27 and the like.

The host interface 21 is where the host 1 and the memory controller 2 exchange data, a command, an RDY/BSY signal, an error detection result, and the like.

The controller 22 is a functional part to control the memory controller 2. Upon receiving a write command and write data from the host 1, the controller 22 outputs the write command and the write data to the memory 3. Upon receiving a read command from the host 1, the controller 22 outputs the read command to the memory 3 and read data to the host 1.

When outputting the read data to the host 1, the controller 22 scans the memory 3 at a scan address selected without limitation to the read address, and stores an error detection result. Upon receiving a status command from the host 1, the controller 22 informs the host 1 of the error detection result. Upon receiving a refresh command from the host 1, the controller 22 writes error-corrected data to the memory 3.

The memory interface 23 is where the memory controller 2 and the memory 3 exchange data, a command, a control signal, an RDY/BSY signal, and the like.

The selector 24 outputs write data upon receiving a binary signal "0" from the controller 22, and outputs an after-mentioned first syndrome upon receiving a binary signal "1" from the controller 22.

The selector 25 outputs write data or the first syndrome upon receiving a binary signal "0" from the controller 22, and outputs an after-mentioned second syndrome upon receiving a binary signal "1" from the controller 22.

The ECC circuit 26 is the circuit for performing error detection and correction. More specifically, the ECC circuit 26 generates the first syndrome of data that have not been written to the memory 3. The ECC circuit 26 then detects and corrects errors in data stored at a read address by using the first syndrome.

The EDC circuit 27 is the circuit for performing error detection. More specifically, the EDC circuit 27 generates the second syndrome of data that have been written to the memory 3. The EDC circuit 27 then detects errors in data stored at a scan address by using the second syndrome.

The present embodiment assumes a case where the memory 3 is used as a ROM. Data that have not been written to the memory 3 contain no errors. Data that have been written to the memory 3 may possibly contain errors due to a "program disturb phenomenon". Data stored at a read address and a scan address may possibly contain errors due not only to the "program disturb phenomenon" but also to a "read disturb phenomenon".

The first syndrome generated by the ECC circuit 26 responds to errors due to the "program disturb phenomenon", which occurs while data are being written to the memory 3 and the "read disturb phenomenon", which occurs after data are written to the memory 3. The second syndrome generated by the EDC circuit 27 responds to errors due only to the "read disturb phenomenon", which occurs after data are written to the memory 3.

The ECC circuit 26 and the EDC circuit 27 generate the first syndrome and the second syndrome, respectively. The memory controller 2 can detect errors due only to the "read disturb phenomenon" using the second syndrome. The memory controller 2 can also detect and correct errors due to the "program disturb phenomenon" and the "read disturb phenomenon" using the first syndrome, in the data in which errors due only to the "read disturb phenomenon" have been detected.

<Writing Process Flow>

Figure 2:
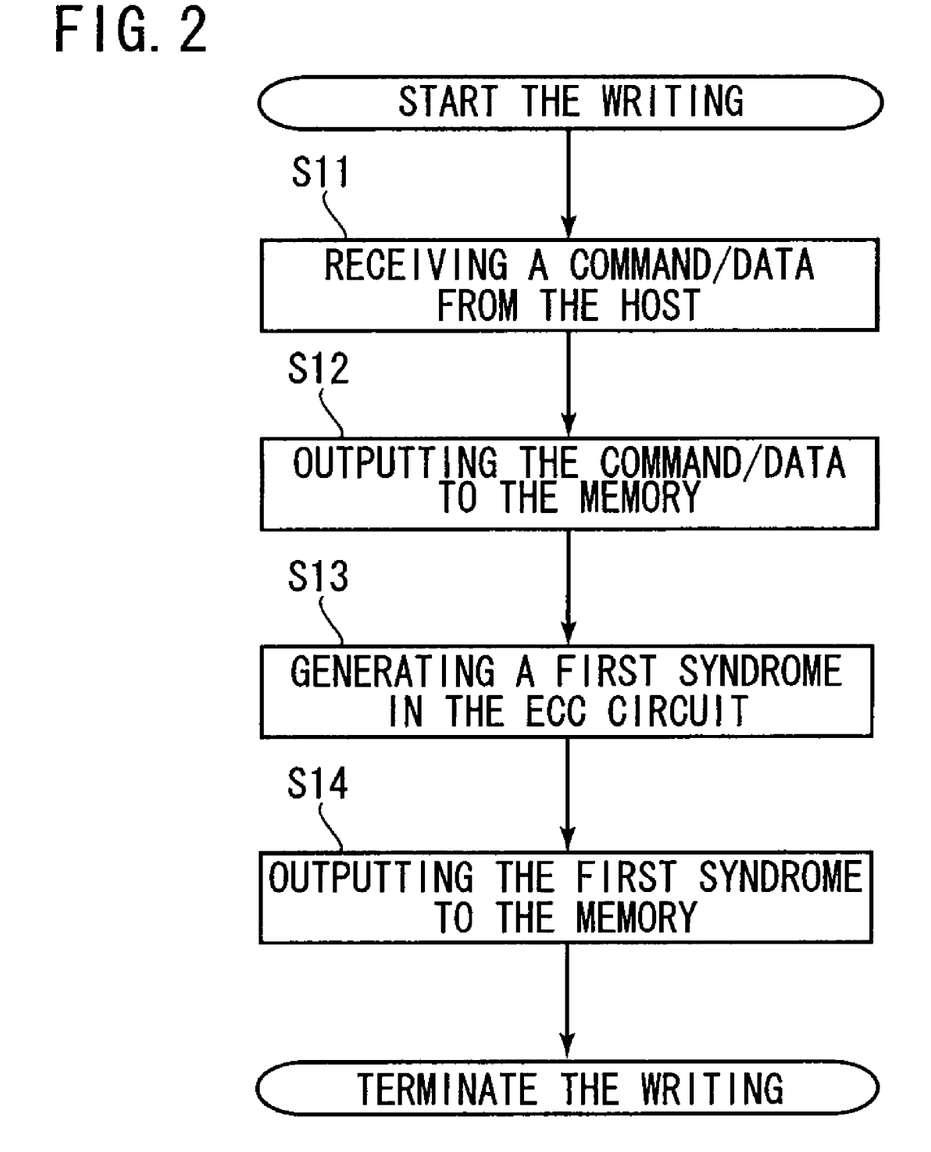
FIG. 2 is a flowchart showing a writing process flow.

The writing process flow is described as follows using FIGS. 1 and 2. FIG. 2 is a flowchart showing the writing process flow in the memory controller 2. In the writing process, the host 1 writes data to the memory 3. The controller 22 controls to write the first syndrome generated by the ECC circuit 26 to the memory 3. It is possible to write the data to the memory 3 by using a data writing apparatus suitable for mass production in the fabrication stage of the memory access system and the memory 3.

The controller 22 receives a write command and write data from the host 1 via the host interface 21 (Step S11), and recognizes the reception of the write command. The controller 22 then outputs an RDY/BSY signal "0" indicating the BUSY state of the memory 3 to the host 1 via the host interface 21.

The controller 22 outputs the write command and a write control signal to the memory 3 via the memory interface 23 (Step S12). The controller 22 then outputs a binary signal "0" to each of the selectors 24 and 25. The controller 22 outputs the write data to the memory 3 via the selectors 24 and 25, and the memory interface 23 (Step S12).

While the controller 22 is outputting the write data to the memory 3, the ECC circuit 26 generates the first syndrome of the write data (Step S13). After outputting the write data to the memory 3, the controller 22 outputs a binary signal "1" to the selector 24, and a binary signal "0" to the selector 25. The controller 22 controls to write the first syndrome generated by the ECC circuit 26 to the memory 3 via the selectors 24 and 25, and the memory interface 23 (Step S14). The controller 22 outputs an RDY/BSY signal "1" indicating the READY state of the memory 3 to the host 1 via the host interface 21.

When the writing process is not complete, the host 1 outputs a new write command and new write data to the memory controller 2 via the host interface 21. Consequently, the processes from Steps S11 to S14 are executed. When the writing process is complete, on the other hand, the host 1 starts the verification reading process, which will be described below using FIGS. 3 and 4.

When the writing process is complete, the memory 3 contains data 311, 312, 313 . . . and first syndromes 321, 322, 323 . . . written thereto. The first syndromes 321, 322, 323 . . . , which are generated by the ECC circuit 26, are the syndromes of the data 311, 312, 313 . . . that have not been written to the memory 3, respectively. In other words, the first syndromes 321, 322, 323 . . . respond to errors that occur while the data 311, 312, 313 . . . are being written to the memory 3 and after the data 311, 312, 313 . . . are written to the memory 3, respectively.

<Verification Reading Process Flow After the Writing>

Figure 4:
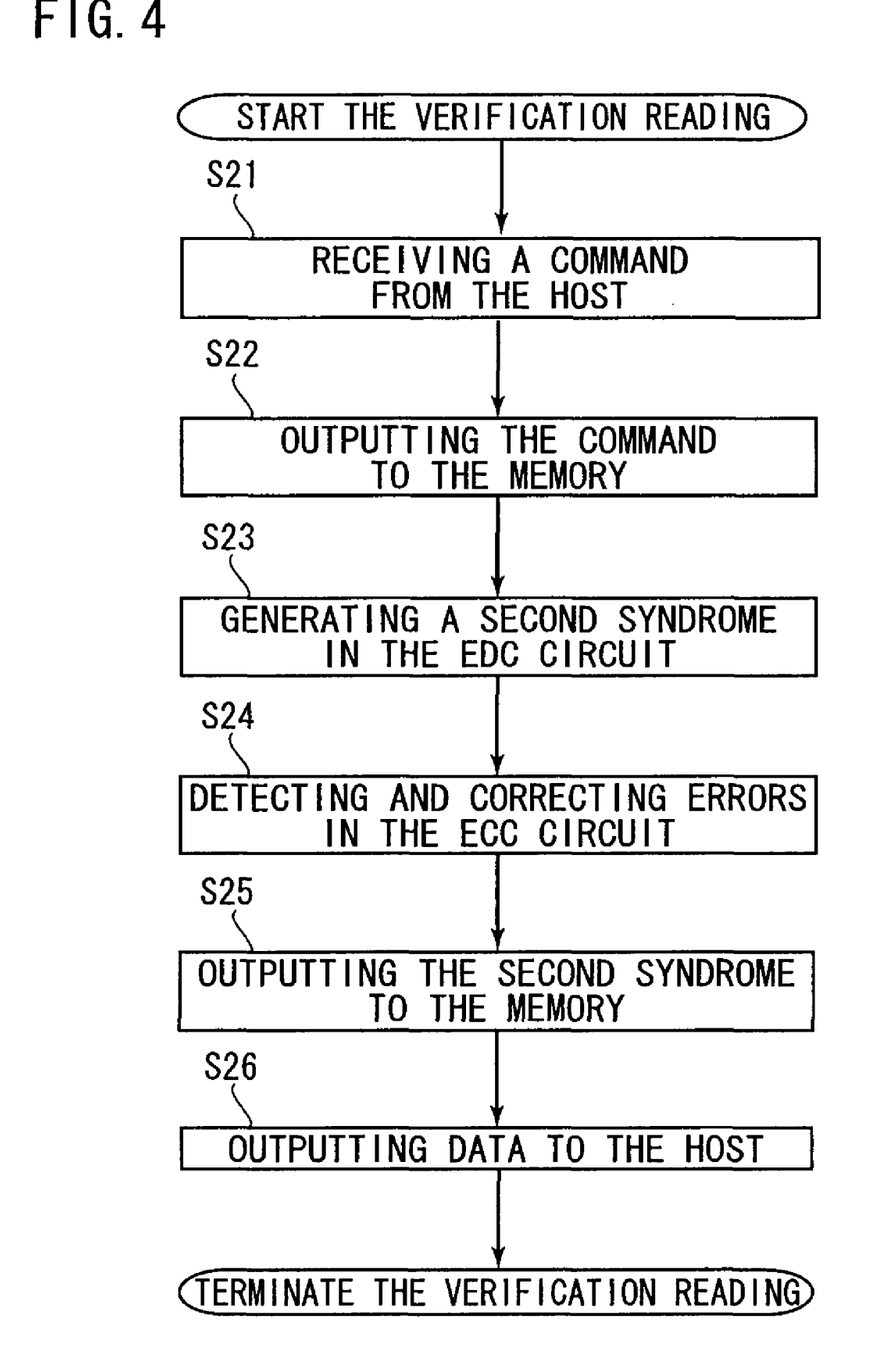
FIG. 4 is a flowchart showing a verification reading process flow.

The verification reading process flow after the writing is described as follows using FIGS. 3 and 4. FIG. 4 is a flowchart showing the verification reading process flow in the memory controller 2. In the verification reading process, the host 1 reads data from the memory 3. The host 1 then confirms that the data read from the memory 3 agrees with the data written thereto. The controller 22 controls to write the second syndrome generated by the EDC circuit 27 to the memory 3. It is possible to read the data from the memory 3 by using a data writing apparatus suitable for mass production.

The controller 22 receives a read command from the host 1 via the host interface 21 (Step S21), and recognizes the reception of the read command. The controller 22 then outputs an RDY/BSY signal "0" indicating the BUSY state of the memory 3 to the host 1 via the host interface 21.

The controller 22 outputs the read command and a read control signal to the memory 3 via the memory interface 23 (Step S22). The read command that the controller 22 outputs to the memory 3 is to read data and the first syndrome thereof from the memory 3.

The EDC circuit 27 receives read data from the memory 3 via the memory interface 23. The EDC circuit 27 then generates the second syndrome of the read data (Step S23). The ECC circuit 26 receives the read data and the first syndrome thereof from the memory 3 via the memory interface 23. The ECC circuit 26 then detects and corrects errors in the read data using the first syndrome (Step S24). The controller 22 outputs a binary signal "1" to the selector 25. The controller 22 controls to write the second syndrome generated by the EDC circuit 27 to the memory 3 via the selector 25 and the memory interface 23 (Step S25).

The controller 22 outputs an RDY/BSY signal "1" indicating the READY state of the memory 3 to the host 1 via the host interface 21. The ECC circuit 26 outputs the error-corrected read data to the host 1 via the host interface 21 (Step S26). The host 1 compares the data written to the memory 3 at Step S11 and the data read therefrom at Step S26. Once the host 1 has confirmed that both data agree with each other, no problem arises when the host 1 processes the read data even if the data written to the memory 3 contain errors due to the "program disturb phenomenon".

When the verification reading process is not complete, the host 1 outputs a new read command to the memory controller 2 via the host interface 21. Consequently, the processes from Steps S21 to S26 are executed. When the verification reading process is complete, on the other hand, the host 1 starts the normal reading process, which will be described below using FIGS. 5 and 6.

When the verification reading process is complete, the memory 3 further contains the second syndromes 331, 332, 333 . . . written thereto. The second syndromes 331, 332, 333 . . . , which are generated by the EDC circuit 27, are the syndromes of the data 311, 312, 313 . . . that have been written to the memory 3, respectively. In other words, the second syndromes 331, 332, 333 . . . respond to errors that occur after the data 311, 312, 313 . . . are written to the memory 3, respectively.

The second syndromes 331, 332, 333 . . . may be syndromes generated by the EDC circuit 27 based not only on the data 311, 312, 313 . . . that have been written to the memory 3 but also on the first syndromes 321, 322, 323 . . . that have been written to the memory 3, respectively. In this case, the second syndromes 331, 332, 333 . . . can respond not only to errors that occur after the data 311, 312, 313 . . . are written to the memory 3 but also to errors that occur after the first syndromes 321, 322, 323 . . . are written to the memory 3, respectively.

<Normal Reading Process Flow>

Figure 6:
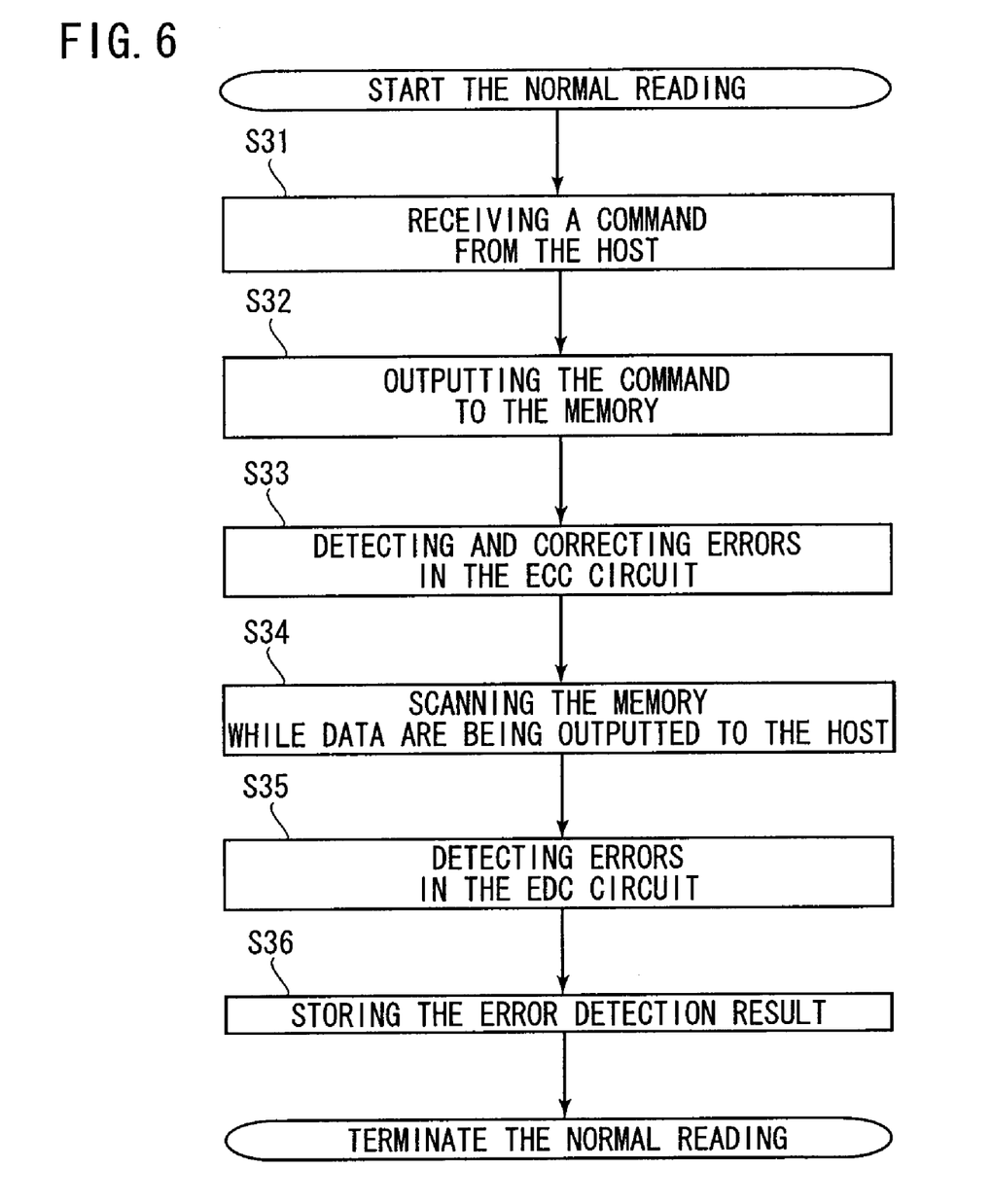
FIG. 6 is a flowchart showing a normal reading process flow.

The normal reading process flow is described as follows using FIGS. 5 and 6. FIG. 6 is a flowchart showing the normal reading process flow in the memory controller 2. In the normal reading process, the host 1 reads data from the memory 3. The controller 22 scans the memory 3. The EDC circuit 27 detects errors in the scan data.

The controller 22 receives a read command from the host 1 via the host interface 21 (Step S31), and recognizes the reception of the read command. The controller 22 then outputs an RDY/BSY signal "0" indicating the BUSY state of the memory 3 to the host 1 via the host interface 21.

The controller 22 outputs the read command and a read control signal to the memory 3 via the memory interface 23 (Step S32). The read command that the controller 22 outputs to the memory 3 is to read data and the first syndrome thereof from the memory 3.

The ECC circuit 26 receives read data and the first syndrome thereof from the memory 3 via the memory interface 23. The ECC circuit 26 then detects and corrects errors in the read data using the first syndrome (Step S33). The controller 22 outputs an RDY/BSY signal "1" indicating the READY state of the memory 3 to the host 1 via the host interface 21.

The ECC circuit 26 outputs the error-corrected read data to the host 1 via the host interface 21 (Step S34).

The controller 22 scans the memory 3 while the ECC circuit 26 is outputting the error-corrected read data to the host 1 (Step S34). The scan address that the controller 22 outputs to the memory 3 is the address at which the scan data are stored. The controller 22 further outputs to the memory 3 the address at which the second syndrome of the scan data is stored. The scanning of the memory 3 by the controller 22 may be performed while the memory 3 is not being accessed such as when the host 1 is powered on or off.

The controller 22 can scan the memory 3 in various methods. A first method is as follows. The controller 22 selects a scan start address by random number generation, and then selects scan addresses by incrementing addresses from the scan start address. The controller 22 scans the memory 3 at the scan start address and the scan addresses. In this method, the controller 22 can easily scan the memory 3 at a wide range of scan addresses without limitation to the read addresses.

A second method is as follows. The controller 22 selects an address at which critical data are stored. The critical data include data that can cause problems in the processes performed by the host 1 when they contain errors. The controller 22 does not increment addresses from the address at which the critical data are stored, but scans the memory 3 only at the address at which the critical data are stored. In this method, the controller 22 can scan the memory 3 intensively at the address at which the critical data are stored.

The EDC circuit 27 receives scan data and the second syndrome thereof from the memory 3 via the memory interface 23. The EDC circuit 27 then detects errors in the scan data using the second syndrome (Step S35), and outputs an error detection result to the controller 22. The controller 22 stores the error detection result (Step S36).

When the normal reading process is not complete, the host 1 outputs a new read command to the memory controller 2 via the host interface 21. Consequently, the processes from Steps S31 to S36 are executed. When the normal reading process is complete, on the other hand, the host 1 can start the refreshing process, which will be described below using FIG. 7.

<Refreshing Process Flow After the Error Detection>

Figure 7:
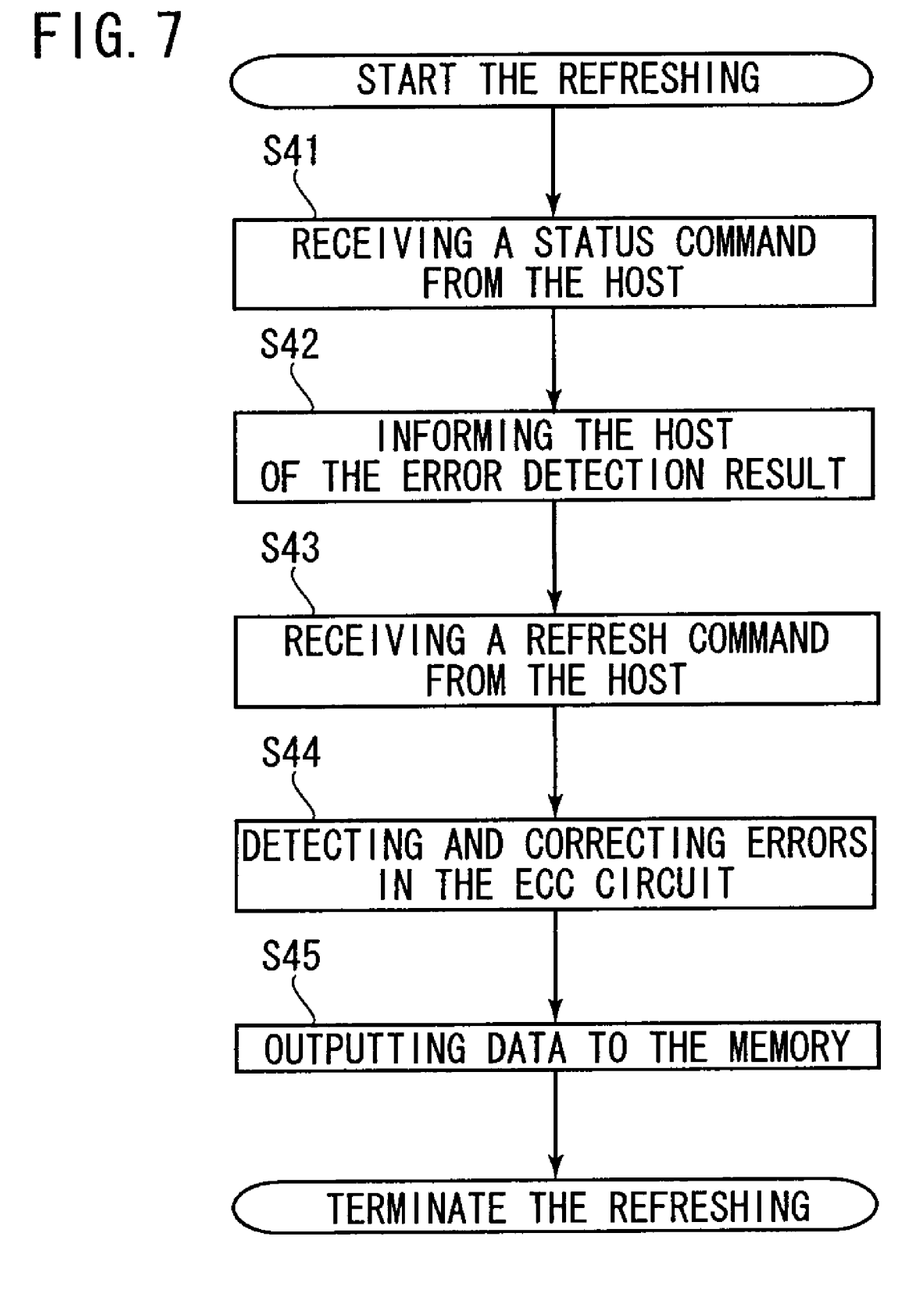
FIG. 7 is a flowchart showing a refreshing process flow.

The refreshing process flow after the error detection is described as follows using FIG. 7. FIG. 7 is a flowchart showing the refreshing process flow in the memory controller 2. In the refreshing process, the host 1 requires the memory controller 2 to inform it of the error detection result. The host 1 then requires the memory controller 2 to correct errors in the error-detected data. The ECC circuit 26 corrects the errors in the error-detected data.

The controller 22 receives a status command from the host 1 via the host interface 21 (Step S41). The timing at which the host 1 outputs the status command to the memory controller 2 may be, for example, when the host 1 is powered on or off, or when the number of times that the host 1 has outputted the read command to the memory controller 2 exceeds a predetermined number. The controller 22 recognizes the reception of the status command. The controller 22 outputs the error detection result to the host 1 via the host interface 21 (Step S42).

The controller 22 receives a refresh command from the host 1 via the host interface 21 (Step S43), and recognizes the reception of the refresh command. The controller 22 then outputs an RDY/BSY signal "0" indicating the BUSY state of the memory 3 to the host 1 via the host interface 21. The controller 22 refreshes the memory 3. The address to be refreshed, which is outputted by the controller 22 to the memory 3, is the address at which the data to be refreshed are stored. The controller 22 further outputs to the memory 3 the address at which the first syndrome of the data to be refreshed is stored.

The ECC circuit 26 receives the data to be refreshed and the first syndrome thereof from the memory 3 via the memory interface 23. The ECC circuit 26 detects and corrects errors in the data to be refreshed using the first syndrome (Step S44). The ECC circuit 26 then outputs the error-corrected data to be refreshed to the controller 22. The controller 22 outputs the error-corrected data to be refreshed to the memory 3 via the memory interface 23 (Step S45). The controller 22 then outputs an RDY/BSY signal "1" indicating the READY state of the memory 3 to the host 1 via the host interface 21.

When the refreshing process is not complete, the host 1 outputs a new refresh command to the memory controller 2 via the host interface 21. Consequently, the processes from Steps S43 to S45 are executed. When the refreshing process is complete, on the other hand, the host 1 starts the normal reading process described using FIGS. 5 and 6. The host 1 and the memory controller 2 can generate a new first syndrome and a new second syndrome as described using FIGS. 1 to 4.

<Summary of the First Embodiment>

Figure 8:
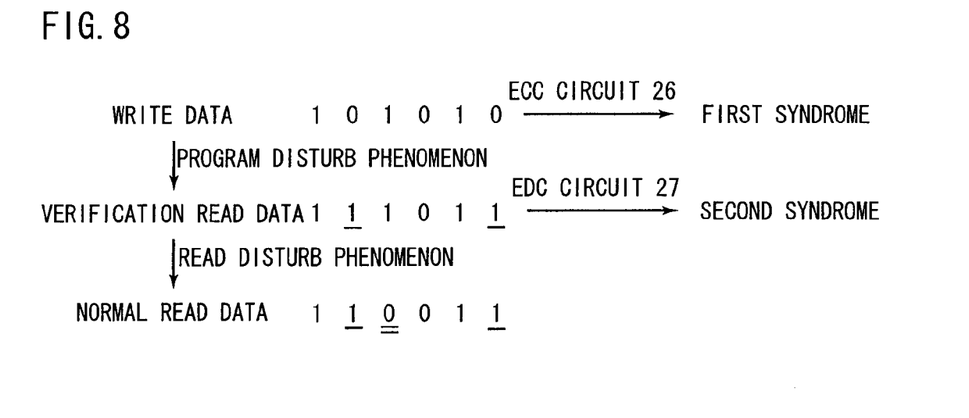
FIG. 8 is a diagram showing a syndrome generation process flow.

The first embodiment is summarized as follows using FIGS. 8 and 9. FIG. 8 is a diagram showing the syndrome generation process flow. The "write data" are data that have not been written to the memory 3. The "verification read data" are data that have been written to the memory 3. The "normal read data" are data stored at a read address.

Now assume that write data are schematically represented as "101010". The ECC circuit 26 generates the first syndrome of the write data (Step S13). The first syndrome responds to errors that have been stored in the write data after the generation of the first syndrome. The errors include errors due to the "program disturb phenomenon" and the "read disturb phenomenon".

Assume that the verification read data are schematically represented as "111011". The comparison between the verification read data and the write data shows that the "program disturb phenomenon" occurs to unintentionally rewrite "0" to "1" as indicated by the single underlines. The EDC circuit 27 generates the second syndrome of the verification read data (Step S23). The second syndrome responds to errors that have been stored in the verification read data after the generation of the second syndrome. The errors include errors due only to the "read disturb phenomenon".

Assume that the normal read data are schematically represented as "110011". The comparison between the normal read data and the verification read data shows that the "read disturb phenomenon" occurs to unintentionally rewrite "1" to "0" as indicated by the double underline.

Figure 9:
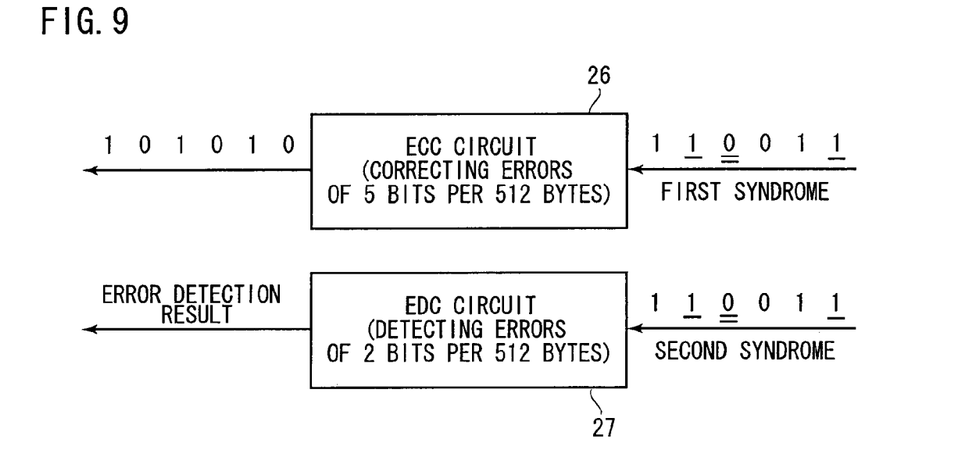
FIG. 9 is a diagram showing an error detection process flow and an error correction process flow.

FIG. 9 is a diagram showing the error detection process flow and the error correction process flow. The present embodiment assumes a case where the memory 3 is used as a ROM. In other words, the writing to the memory 3 is basically performed once, but the reading therefrom is performed repeatedly. Therefore, the frequency at which the "program disturb phenomenon" occurs can be easily guaranteed, but the frequency at which the "read disturb phenomenon" occurs cannot.

In FIG. 9, the frequency at which the "program disturb phenomenon" occurs can be guaranteed at 4 bits per 512 bytes. The EDC circuit 27 can detect errors of 2 bits per 512 bytes. The ECC circuit 26 can correct errors of 5 bits per 512 bytes.

The controller 22 scans the memory 3 at the scan addresses without limitation to the read addresses (Step S34). The EDC circuit 27 detects errors due only to the "read disturb phenomenon" in the scan data "110011" using the second syndrome (Step S35), and outputs the error detection result to the controller 22 (Step S36).

Even when the scan data "110011" contain errors due to the "read disturb phenomenon", the EDC circuit 27 can detect errors due only to the "read disturb phenomenon" at early stage before the errors due to the "read disturb phenomenon" are excessively accumulated. Since the EDC circuit 27 only detects errors due only to the "read disturb phenomenon", the errors can be detected at high speed.

The ECC circuit 26 detects and corrects errors due to the "program disturb phenomenon" and the "read disturb phenomenon" in the normal read data (or the data to be refreshed), "110011" using the first syndrome (Steps S33 and S44). The ECC circuit 26 then outputs the error-corrected normal read data (or the data to be refreshed), "101010" to the controller 22.

The errors due to the "read disturb phenomenon" are detected and corrected at early stage before the errors due to the "read disturb phenomenon" are excessively accumulated. Therefore, the normal read data (or the data to be refreshed), "110011" contain few errors, if any, due to the "read disturb phenomenon". For example, the frequency at which the "read disturb phenomenon" occurs can be guaranteed at 1 bit per 512 bytes. Therefore, the ECC circuit 26 does not need to have error correcting capability high enough to detect and correct errors due to the "program disturb phenomenon" and the "read disturb phenomenon".

In other words, the error correcting capability of the ECC circuit 26 can be set to as low as 5 bits per 512 bytes by considering the frequency of the "program disturb phenomenon" (4 bits per 512 bytes) and the frequency of the "read disturb phenomenon" (1 bit per 512 bytes). The memory controller 2 can reduce the time required for the error detection and correction without increasing the circuit size.

The ECC circuit 26 detects and corrects errors in the scan data in which errors due only to the "read disturb phenomenon" have been detected. The ECC circuit 26, however, does not detect and correct errors in data in which errors due to the "program disturb phenomenon" have been also detected. Therefore, the memory controller 2 can reduce the time required for the error detection and correction, and also prevent degradation of the memory cell due to excessive refreshing process.

Second Embodiment

Figure 10:
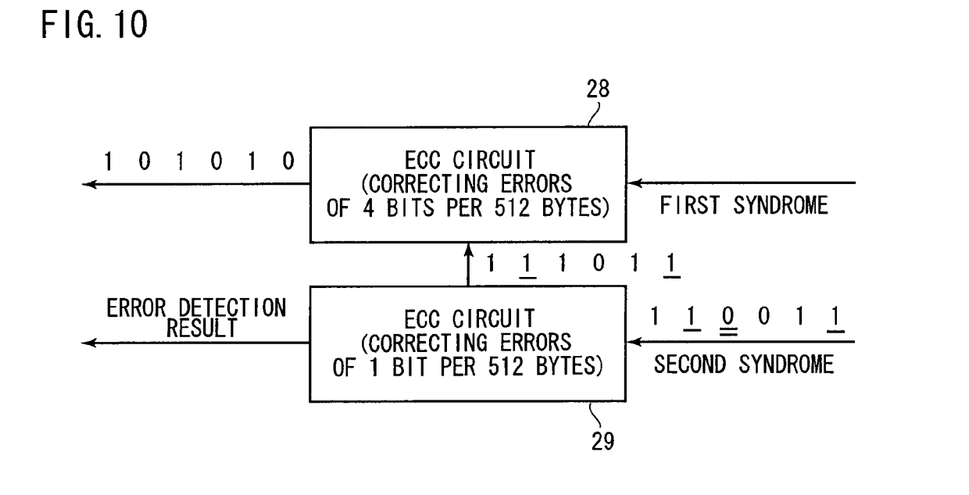
FIG. 10 is a diagram showing an error detection process flow and an error correction process flow.

A second embodiment is described as follows using FIG. 10. FIG. 10 is a diagram showing an error detection process flow and an error correction process flow according to the second embodiment. The memory controller 2 of the second embodiment differs from that of the first embodiment in having an ECC circuit 28 instead of the ECC circuit 26 and an ECC circuit 29 instead of the EDC circuit 27.

In the second embodiment, as in the first embodiment, the frequency at which the "program disturb phenomenon" occurs is guaranteed at 4 bits per 512 bytes. The ECC circuit 29 can correct errors of 1 bit per 512 bytes, thereby detecting errors of at least 2 bits per 512 bytes. The ECC circuit 28 can correct errors of 4 bits per 512 bytes.

The process flows of the second embodiment differ from those of the first embodiment in the error correction process flow (corresponding to Steps S24, S33, and S44). First, the syndrome generation process proceeds as follows. The ECC circuit 28 generates the first syndrome of the write data "101010" (corresponding to Step S13). The ECC circuit 29 generates the second syndrome of the verification read data "111011" (corresponding to Step S23).

Next, the error detection process proceeds as follows. The ECC circuit 29 detects errors due only to the "read disturb phenomenon" in the scan data "110011" using the second syndrome (corresponding to Step S35). The ECC circuit 29 then outputs the error detection result to the controller 22 (corresponding to Step S36).

Next, the error correction process proceeds as follows. The ECC circuit 29 detects and corrects errors due only to the "read disturb phenomenon" in the normal read data (or the data to be refreshed), "110011" using the second syndrome. The ECC circuit 29 then outputs to the ECC circuit 28 the normal read data (or the data to be refreshed), "111011" in which the errors due only to the "read disturb phenomenon" have been corrected.

The ECC circuit 28 detects and corrects errors due only to the "program disturb phenomenon" using the first syndrome in the normal read data (or the data to be refreshed), "111011" in which the errors due only to the "read disturb phenomenon" have been corrected. The ECC circuit 28 then outputs to the controller 22 the normal read data (or the data to be refreshed), "101010" in which the errors due to the "program disturb phenomenon" and the "read disturb phenomenon" have been corrected.

In the first embodiment, the ECC circuit 26 has error correcting capability, but the EDC circuit 27 does not as described using FIG. 9. In the second embodiment, on the other hand, both the ECC circuits 28 and 29 have error correcting capability as described using FIG. 10. Therefore, although the memory controller 2 of the second embodiment requires more time for error detection and correction than the memory controller 2 of the first embodiment, the ECC circuit 28 can be formed to have lower error correcting capability than the ECC circuit 26.

Third Embodiment

Figure 11:
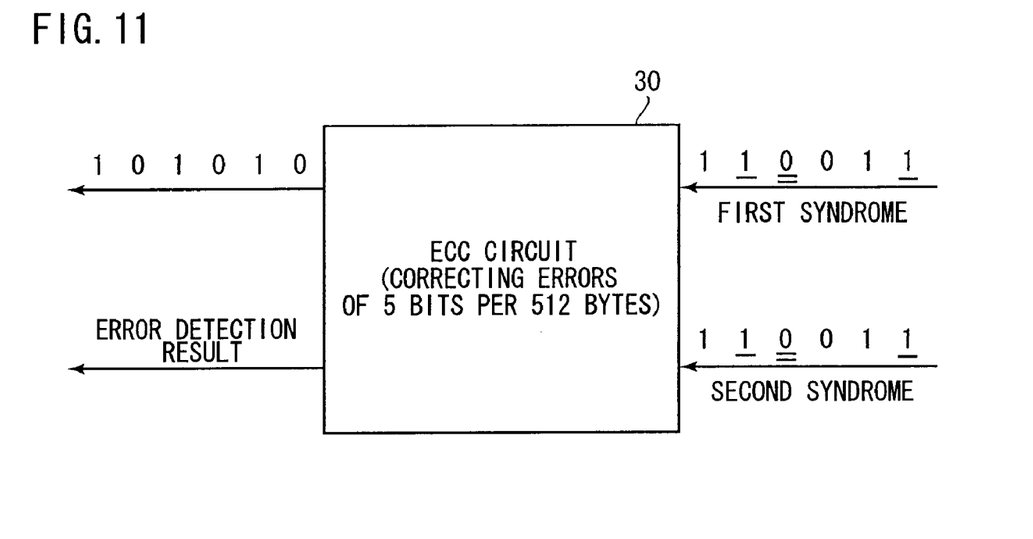
FIG. 11 is a diagram showing an error detection process flow and an error correction process flow.

A third embodiment is described as follows using FIG. 11. FIG. 11 is a diagram showing an error detection process flow and an error correction process flow according to the third embodiment. The memory controller 2 of the third embodiment differs from that of the first embodiment in having an ECC circuit 30 instead of the ECC circuit 26 and the EDC circuit 27.

More specifically, in the first embodiment, the ECC circuit 26 and the EDC circuit 27 are composed of different circuit blocks from each other. In the second embodiment, the ECC circuits 28 and 29 are composed of different circuit blocks from each other. In the third embodiment, on the other hand, the ECC circuit 30 is composed of a single circuit block.

In the third embodiment, in the same manner as in the first embodiment, the frequency at which the "program disturb phenomenon" occurs is guaranteed at 4 bits per 512 bytes. The ECC circuit 30 can correct errors of 5 bits per 512 bytes.

The process flows of the third embodiment differ from those of the first embodiment in the error correction process flow (corresponding to Steps S24, S33, and S44). First, the syndrome generation process proceeds as follows. The ECC circuit 30 generates the first syndrome of the write data "101010" (corresponding to Step S13). The ECC circuit 30 then generates the second syndrome of the verification read data "111011" (corresponding to Step S23).

Next, the error detection process proceeds as follows. The ECC circuit 30 detects errors due only to the "read disturb phenomenon" in the scan data "110011" using the second syndrome (corresponding to Step S35). The ECC circuit 30 then outputs the error detection result to the controller 22 (corresponding to Step S36).

Next, the error correction process proceeds as follows. The ECC circuit 30 detects and corrects errors due to the "program disturb phenomenon" and the "read disturb phenomenon" in the normal read data (or the data to be refreshed), "11001" using the first syndrome (corresponding to Steps S33 and S44). The ECC circuit 30 then outputs to the controller 22 the normal read data (or the data to be refreshed), "101010" in which the errors due to the "program disturb phenomenon" and the "read disturb phenomenon" have been corrected.

In the first embodiment, as described using FIG. 9, the memory controller 2 has two circuits: one for error detection and the other for error correction. In the third embodiment, on the other hand, as described using FIG. 11, the memory controller 2 has a single circuit for error detection and correction. Therefore, the memory controller 2 of the third embodiment requires more time for error detection and correction, but can have a smaller circuit size than the memory controller 2 of the first embodiment.

Modified Embodiment

<Detecting Errors in Normal Read Data>

The EDC circuit 27 detects errors due only to the "read disturb phenomenon" in scan data using the second syndrome in the first embodiment. Alternatively, the EDC circuit 27 may detect errors due only to the "read disturb phenomenon" in normal read data using the second syndrome.

The controller 22 outputs a read command and a read control signal to the memory 3 via the memory interface 23. The read command that the controller 22 outputs to the memory 3 is to read data and the first and second syndromes thereof from the memory 3.

The ECC circuit 26 receives read data and the first syndrome thereof from the memory 3 via the memory interface 23. The EDC circuit 27 receives the read data and the second syndrome thereof from the memory 3 via the memory interface 23.

The ECC circuit 26 detects and corrects errors in the read data using the first syndrome. The ECC circuit 26 then outputs the error-corrected read data to the host 1 via the host interface 21. The EDC circuit 27 detects errors in the read data using the second syndrome, and informs the controller 22 of the error detection result of the read data.

In the present modified embodiment, as in the first embodiment, the controller 22 may scan the memory 3 while the ECC circuit 26 is outputting the error-corrected read data to the host 1. In this case, the EDC circuit 27 can inform the controller 22 of not only the error detection result of the read data but also the error detection result of the scan data.

Also in the second embodiment, the ECC circuit 29 may detect errors due only to the "read disturb phenomenon" in normal read data using the second syndrome. Also in the third embodiment, the ECC circuit 30 may detect errors due only to the "read disturb phenomenon" in normal read data using the second syndrome.

<Syndrome Generation By the Host>

The first and second syndromes, which are generated by the memory controller 2 in the first to third embodiments, may be generated by the host 1.

First, the host 1 generates the first syndrome of data that have not been written to the memory 3. Then, the host 1 writes the write data and the first syndrome thereof to the memory 3.

Next, the host 1 reads the data that have been written to the memory 3 therefrom without passing through the ECC circuit 26, 28, or 30. Then, the host 1 generates the second syndrome of the data that have been written to the memory 3. The host 1 then writes the second syndrome to the memory 3.

While the invention has been shown and described in detail, the foregoing description is in all aspects illustrative and not restrictive. It is therefore understood that numerous modifications and variations can be devised without departing from the scope of the invention.

What is claimed is:

1. A memory access system comprising:
a memory controller for controlling access to a memory; and
a host for outputting a command to said memory controller, wherein said memory controller comprises:
a first syndrome generating part for generating a first syndrome of first data not yet written to said memory, said first syndrome being used to correct a first error occurring in said first data;
a second syndrome generating part for generating a second syndrome of second data already written to said memory, said second syndrome being used to detect a second error occurring in said second data;
an error detection part for detecting said second error using said second syndrome, said second error occurring in third data read from said memory;
a first error correction part for correcting said first error using said first syndrome, said first error occurring in data in which said second error has been detected, out of said third data; and
a data writing part for writing data in which said first error has been corrected to said memory.

2. A memory access system comprising:
a memory controller for controlling access to a memory; and
a host for outputting a command to said memory controller, wherein said host comprises:
a first syndrome generating part for generating a first syndrome of first data not yet written to said memory, said first syndrome being used to correct a first error occurring in said first data; and
a second syndrome generating part for generating a second syndrome of second data already written to said memory, said second syndrome being used to detect a second error occurring in said second data, and
said memory controller comprises:
an error detection part for detecting said second error using said second syndrome, said second error occurring in third data read from said memory;
a first error correction part for correcting said first error using said first syndrome, said first error occurring in data in which said second error has been detected, out of said third data; and
a data writing part for writing data in which said first error has been corrected to said memory.

3. The memory access system according to claim 1 or 2, wherein said memory controller further comprises:
a second error correction part for correcting said first error using said first syndrome, said first error occurring in data read from said memory so as to be processed by said host.

4. The memory access system according to claim 1 or 2, wherein said error detection part and said error correction part are realized by different circuits from each other.

5. The memory access system according to claim 1 or 2, wherein said error detection part and said error correction part are realized by a single circuit.

6. A memory access system comprising:
a memory controller for controlling access to a memory; and
a host for outputting a command to said memory controller, wherein said memory controller comprises:
a first syndrome generating part for generating a first syndrome of first data not yet written to said memory, said first syndrome being used to correct a first error occurring in said first data;
a second syndrome generating part for generating a second syndrome of second data already written to said memory, said second syndrome being used to correct a second error occurring in said second data;
an error detection part for detecting said second error using said second syndrome, said second error occurring in third data read from said memory;
a second error correction part for correcting said second error using said second syndrome, said second error occurring in data in which said second error has been detected, out of said third data;
a first error correction part for correcting said first error using said first syndrome, said first error occurring in data in which said second error has been corrected; and
a data writing part for writing data in which said first error has been corrected to said memory.

7. A memory access system comprising:
a memory controller for controlling access to a memory; and
a host for outputting a command to said memory controller, wherein said host comprises:
a first syndrome generating part for generating a first syndrome of first data not yet written to said memory, said first syndrome being used to correct a first error occurring in said first data; and
a second syndrome generating part for generating a second syndrome of second data already written to said memory, said second syndrome being used to correct a second error occurring in said second data, and
said memory controller comprises:
an error detection part for detecting said second error using said second syndrome, said second error occurring in third data read from said memory;
a second error correction part for correcting said second error using said second syndrome, said second error occurring in data in which said second error has been detected, out of said third data;
a first error correction part for correcting said first error using said first syndrome, said first error occurring in data in which said second error has been corrected; and
a data writing part for writing data in which said first error has been corrected to said memory.

8. The memory access system according to claim 6 or 7, wherein said memory controller further comprises:
a third error correction part for correcting said second error using said second syndrome, said second error occurring in data read from said memory so as to be processed by said host; and
a fourth error correction part for correcting said first error using said first syndrome, said first error occurring in data in which said second error has been corrected, out of data read from said memory so as to be processed by said host.

9. The memory access system according to any of claim 1, 2, 6, or 7, wherein said third data includes data read from an address selected using a predetermined algorithm when said memory is not being accessed.

10. The memory access system according to any of claim 1, 2, 6, or 7, wherein said third data includes data read from said memory so as to be processed by said host.

11. The memory access system according to any of claim 1, 2, 6, or 7, wherein said second data includes said first syndrome.

* * * * *